United States Patent
Karlsson et al.

(10) Patent No.: US 11,224,117 B1
(45) Date of Patent: Jan. 11, 2022

(54) HEAT TRANSFER IN THE PRINTED CIRCUIT BOARD OF AN SMPS BY AN INTEGRATED HEAT EXCHANGER

(71) Applicant: Flex Ltd., Singapore (SG)

(72) Inventors: Magnus Karlsson, Oskarshamn (SE); Oscar Persson, Kalmar (SE)

(73) Assignee: Flex Ltd., Singapore (SG)

( * ) Notice: Subject to any disclaimer, the term of this patent is extended or adjusted under 35 U.S.C. 154(b) by 661 days.

(21) Appl. No.: 16/028,238

(22) Filed: Jul. 5, 2018

(51) Int. Cl.
*H05K 7/20* (2006.01)
*H05K 1/02* (2006.01)
*H05K 1/18* (2006.01)

(52) U.S. Cl.
CPC ........... *H05K 1/0203* (2013.01); *H05K 1/181* (2013.01); *H05K 1/182* (2013.01); *H05K 7/20436* (2013.01); *H05K 2201/06* (2013.01); *H05K 2201/10007* (2013.01); *H05K 2201/10431* (2013.01)

(58) Field of Classification Search
CPC ...... H05K 1/0203; H05K 1/181; H05K 1/182; H05K 7/20436; H05K 2201/10431; H05K 2201/10007; H05K 2201/06
USPC ........................................................ 361/720
See application file for complete search history.

(56) References Cited

U.S. PATENT DOCUMENTS

| | | |
|---|---|---|
| 3,671,726 A | 6/1972 | Kerr |
| 3,739,232 A | 6/1973 | Grossman |
| 3,755,061 A | 8/1973 | Schurb |
| 3,834,823 A | 9/1974 | Seregely |
| 4,055,424 A | 10/1977 | Chu |
| 4,447,286 A | 5/1984 | Weglin |
| 4,518,833 A | 5/1985 | Watkins |

(Continued)

FOREIGN PATENT DOCUMENTS

| | | |
|---|---|---|
| CN | 108020164 A | 10/2016 |
| KR | 20090080701 A | 7/2009 |

OTHER PUBLICATIONS

Non-Final Office Action, dated May 20, 2020, U.S. Appl. No. 16/221,256, filed Dec. 14, 2018, applicant: Cheng Yang, 18 pages.

(Continued)

*Primary Examiner* — Anatoly Vortman
*Assistant Examiner* — Zhengfu J Feng
(74) *Attorney, Agent, or Firm* — Haverstock & Owens LLP

(57) ABSTRACT

An integrated heat exchanger has a heat exchanger within a circuit board. The circuit board can be a PCB having one or more electronic components coupled to its top-side surface. The conductive layers of the PCB include a first sub-set of electrically conductive interconnects and as second sub-set of electrically conductive interconnects. The first sub-set of conductive layers are electrically connected to each other and to the one or more electronic components. The second sub-set of conductive layers are electrically isolated from the first sub-set of conductive layers by intervening non-conductive layers such as prepreg. In this manner, the heat exchanger is electrically isolated from the one or more electronic components. The second sub-set of conductive layers include a dedicated top-side conductive layer to which a baseplate can be attached. The baseplate is also attached to the one or more electronic components via an electrically non-conductive gap filler.

21 Claims, 2 Drawing Sheets

(56) References Cited

U.S. PATENT DOCUMENTS

| | | | |
|---|---|---|---|
| 4,568,629 A | 2/1986 | Kinashi | |
| 4,630,172 A | 12/1986 | Stenerson | |
| 4,670,351 A | 6/1987 | Keane | |
| 4,711,026 A | 12/1987 | Swiggett | |
| 4,755,417 A * | 7/1988 | Detoma | H05K 3/4641 |
| | | | 428/209 |
| 4,795,512 A | 1/1989 | Nakatani | |
| 4,828,961 A | 5/1989 | Lau | |
| 4,837,408 A | 6/1989 | Kondo | |
| 5,153,050 A | 10/1992 | Johnston | |
| 5,159,750 A | 11/1992 | Dutta | |
| 5,227,223 A | 7/1993 | Morgan | |
| 5,347,712 A | 9/1994 | Yasuda | |
| 5,409,884 A | 4/1995 | Harada | |
| 5,427,174 A | 6/1995 | Lomolino, Sr. et al. | |
| 5,459,639 A | 10/1995 | Izumi | |
| 5,784,782 A | 7/1998 | Boyko | |
| 5,876,859 A | 3/1999 | Saxelby, Jr. | |
| 6,031,281 A | 2/2000 | Kang | |
| 6,035,524 A | 3/2000 | Suppa | |
| 6,090,237 A | 7/2000 | Reynolds | |
| 6,188,578 B1 * | 2/2001 | Lin | H01L 23/36 |
| | | | 165/185 |
| 6,214,525 B1 | 4/2001 | Boyko | |
| 6,708,515 B2 | 3/2004 | Malone et al. | |
| 6,714,413 B1 | 3/2004 | Ghosh et al. | |
| 7,037,561 B2 | 5/2006 | Narita | |
| 7,687,899 B1 | 3/2010 | Berry | |
| 7,872,343 B1 | 1/2011 | Berry | |
| 7,898,068 B2 | 3/2011 | Smeys | |
| 8,020,291 B2 | 9/2011 | Kumar | |
| 8,283,767 B1 | 10/2012 | Berry | |
| 8,409,917 B2 | 4/2013 | Yoon | |
| 8,519,270 B2 | 8/2013 | Chang | |
| 8,735,739 B2 * | 5/2014 | Ishihara | H05K 3/4697 |
| | | | 174/261 |
| 8,884,166 B2 | 11/2014 | Inatani | |
| 8,941,225 B2 | 1/2015 | Choi | |
| 10,121,722 B1 | 11/2018 | Jha | |
| 10,186,480 B2 | 1/2019 | Muthukumar | |
| 2001/0010303 A1 | 8/2001 | Caron | |
| 2003/0020905 A1 | 1/2003 | Savareigo | |
| 2003/0205363 A1 | 11/2003 | Chu et al. | |
| 2004/0089472 A1 | 5/2004 | Ninomiya | |
| 2004/0130730 A1 | 7/2004 | Cantin | |
| 2004/0219342 A1 | 11/2004 | Boggs | |
| 2005/0005996 A1 | 1/2005 | Mizutani | |
| 2006/0017936 A1 | 1/2006 | Cantin | |
| 2006/0117764 A1 | 6/2006 | Patel et al. | |
| 2007/0017697 A1 | 1/2007 | Hsu | |
| 2007/0054104 A1 | 3/2007 | Ittel et al. | |
| 2007/0246254 A1 | 10/2007 | Kumar | |
| 2007/0284138 A1 * | 12/2007 | Chen | H05K 3/361 |
| | | | 174/260 |
| 2008/0093118 A1 | 4/2008 | Takahashi | |
| 2008/0099230 A1 | 5/2008 | Takahasi | |
| 2008/0282540 A1 | 11/2008 | Singleton | |
| 2009/0140415 A1 | 6/2009 | Furuta | |
| 2009/0166835 A1 | 7/2009 | Yang | |
| 2009/0229876 A1 | 9/2009 | Takahashi | |
| 2009/0243072 A1 | 10/2009 | Ha | |
| 2009/0257707 A1 | 10/2009 | Shibata | |
| 2010/0014265 A1 | 1/2010 | Sagisaka | |
| 2010/0018634 A1 | 1/2010 | Takahashi | |
| 2010/0025087 A1 | 2/2010 | Takahashi | |
| 2010/0148356 A1 | 6/2010 | Tamaki | |
| 2010/0159765 A1 | 6/2010 | Jian | |
| 2010/0288540 A1 | 11/2010 | Honjo | |
| 2011/0031598 A1 | 2/2011 | Lee | |
| 2011/0067904 A1 | 3/2011 | Aoyama | |
| 2011/0135248 A1 | 6/2011 | Langer | |
| 2011/0163457 A1 | 7/2011 | Mohan | |
| 2011/0180307 A1 | 7/2011 | Naganuma | |
| 2011/0198111 A1 | 8/2011 | Naganuma | |
| 2011/0199739 A1 | 8/2011 | Naganuma | |
| 2012/0024575 A1 | 2/2012 | Zhang | |
| 2012/0325524 A1 | 12/2012 | Naganuma | |
| 2013/0069239 A1 | 3/2013 | Kim | |
| 2013/0214396 A1 | 8/2013 | Kim | |
| 2013/0299223 A1 | 11/2013 | Yoo | |
| 2013/0341078 A1 | 12/2013 | Hardin | |
| 2014/0035118 A1 * | 2/2014 | Bayerer | H01L 23/36 |
| | | | 257/690 |
| 2014/0312481 A1 | 10/2014 | Daesik | |
| 2015/0084170 A1 | 3/2015 | Im | |
| 2015/0090688 A1 | 4/2015 | Ajojan | |
| 2015/0092380 A1 * | 4/2015 | Hohlfeld | H05K 1/11 |
| | | | 361/783 |
| 2015/0114689 A1 | 4/2015 | Ishihara | |
| 2015/0114690 A1 | 4/2015 | Ishihara | |
| 2015/0257278 A1 | 9/2015 | Niskala | |
| 2015/0287672 A1 | 10/2015 | Yazdani | |
| 2015/0349221 A1 * | 12/2015 | Odnoblyudov | H01L 33/60 |
| | | | 257/98 |
| 2016/0043047 A1 | 2/2016 | Shim | |
| 2016/0324012 A1 | 11/2016 | Qiu | |
| 2016/0329272 A1 | 11/2016 | Geissler | |
| 2017/0047308 A1 | 2/2017 | Ho | |
| 2017/0092561 A1 * | 3/2017 | Eid | H01L 23/3675 |
| 2017/0265298 A1 | 9/2017 | Zhang | |
| 2018/0164921 A1 | 6/2018 | Leigh | |
| 2018/0269181 A1 | 9/2018 | Yang | |
| 2018/0277485 A1 | 9/2018 | Han | |
| 2018/0315740 A1 | 11/2018 | Im | |
| 2019/0067207 A1 | 2/2019 | Hu | |
| 2019/0067258 A1 | 2/2019 | Kim | |
| 2019/0074267 A1 | 3/2019 | Yang | |
| 2019/0103364 A1 | 4/2019 | Kim | |
| 2019/0215948 A1 * | 7/2019 | Arnitz | H05K 1/0216 |
| 2019/0229046 A1 | 7/2019 | Tsai | |
| 2019/0269005 A1 * | 8/2019 | He | F28F 3/02 |
| 2019/0378795 A1 | 12/2019 | Lee | |
| 2020/0043299 A1 | 2/2020 | Mabille | |
| 2020/0105719 A1 | 4/2020 | Li | |
| 2020/0108768 A1 | 4/2020 | Ali | |
| 2020/0194330 A1 | 6/2020 | Ramanathan | |
| 2020/0029492 A1 | 9/2020 | Bhagavat | |

OTHER PUBLICATIONS

A German Office Action issued by the German Patent Office dated May 17, 2021, file No. 11 2012 002 949.6, 5 pages.

* cited by examiner

HEAT TRANSFER IN THE PRINTED CIRCUIT BOARD OF AN SMPS BY AN INTEGRATED HEAT EXCHANGER

FIELD OF THE INVENTION

The present invention is generally directed to printed circuit boards and power supplies. More specifically, the present invention is directed to heat transfer in the printed circuit board of a switch mode power supply (SMPS) using an integrated heat exchanger.

BACKGROUND OF THE INVENTION

In many applications where power supplies, such as SMPS (Switch Mode Power Supplies), are used, there are constantly increasing demands for more power. With increased power comes greater heat generation in the form of losses. Design considerations must account for dissipating the heat and cooling the power supply in a timely fashion. Previous techniques have transferred the heat from the power supply through its connecting pins down to the application printed circuit board (PCB) to which the power supply is attached. The application PCB functions as a large heat sink. However, application PCBs now can reach temperatures of 85 degree C. and above. Consequently, a cooling path that uses a PCB for heat dissipation is no longer viable as an effective cooling means for an attached power supply.

Further heat dissipation techniques can utilize heat sinks or fluid cooling mounted directly on a SMPS baseplate. A baseplate is a mechanical component, often made of aluminum, that has several purposes including transferring heat from the components mounted on the SMPS PCB, distributing the heat over the SMPS, averaging out the temperature gradient over the SMPS's components, and making the top-side flat so that a generic heat-sink can be mounted on top of the baseplate.

In many applications, there is an isolation requirement that means a primary side of the SMPS must be electrically isolated from a secondary side. Such isolation is typically accomplished by galvanic or capacitive isolation. In the case where the baseplate/heatsink is coupled to a primary side electronic component for heat dissipation, the baseplate/heatsink must be floating relative to a secondary side (of the SMPS) ground potential, with a certain isolation requirement, for example 500V or 750V. Such isolation of the baseplate/heatsink is often accomplished by having the baseplate only contact the electronic components of the SMPS, other than non-conductive mounts supporting the baseplate to the PCB. The primary side to baseplate/heatsink may have another often higher isolation requirement, for example 1500V or 2250V. This requires large physical distances and/or electrical isolation means between the conducting materials, such as between the electronic components and the baseplate. Electrical isolators, for example air, plastic, FR4, or other specific thermal gap-filler materials or gap-pads, are often used, but such electrical isolators often have poor thermal conductivity, which reduces the heat transfer between the electronic components and the baseplate. Further, the production process step associated with using thermal gap filler materials or gap-pads is cumbersome and is often a cause of lower yield. Still further, movement caused by changing temperatures and different temperature expansion coefficients can also cause field failures for sensitive components such as magnetic cores.

A common aspect of conventional cooling methods is that the techniques are designed for cooling the electronic components, such as integrated circuits (ICs) and switching devices/MOSFETs. While the performance of such electronic components is continually improving in efficiency, this means, in a SMPS, a larger part of the power losses originate from the losses in connection, for example the electrically conductive layers (copper layers) in the PCB. Since these electrically conductive layers are buried inside the PCB, the existing cooling techniques that rely on heat transfer from direct contact of the electronic component to a baseplate/heatsink cannot be used with a good result. Heat pipes implemented inside the PCB have been used to address this issue, but such implementation is costly and adds manufacturing complexity.

SUMMARY OF THE INVENTION

Embodiments are directed to an integrated heat exchanger having a heat exchanger within a circuit board. The circuit board can be a PCB having one or more electronic components coupled to its top-side surface. The conductive layers of the PCB include a first sub-set of electrically conductive interconnects and a second sub-set of electrically conductive interconnects. The first sub-set of conductive layers are electrically connected to each other and to the one or more electronic components. The second sub-set of conductive layers are electrically isolated from the first sub-set of conductive layers by intervening non-conductive layers such as prepreg. In this manner, the heat exchanger is electrically isolated from the one or more electronic components. The second sub-set of conductive layers include a dedicated top-side conductive layer to which a baseplate can be attached. The baseplate is also attached to the one or more electronic components via an electrically non-conductive gap filler.

In an aspect, an integrated heat exchanger is disclosed. The integrated heat exchanger includes a circuit board, an electronic component, and a baseplate. The circuit board comprises a plurality of electrically non-conductive layers and a plurality of electrically conductive layers. The plurality of electrically conductive layers comprise a first subset of electrically conductive layers and a second subset of electrically conductive layers electrically isolated from the first subset of electrically conductive layers by intervening electrically non-conductive layers, wherein the second subset of electrically conductive layers includes an interface conductive layer on a first surface of the circuit board. The electronic component is coupled to a first surface of the circuit board and electrically connected to the first subset of electrically conductive layers. The baseplate is mounted to the electronic component and to the interface conductive layer on the first surface of the circuit board. The baseplate is thermally coupled to and electrically isolated from the electronic component, and thermally and electrically coupled to the interface conductive layer. In some embodiments, the integrated heat exchanger also includes a heat sink coupled to the baseplate. In some embodiments, the plurality of electrically non-conductive layers are thermally conductive, and a thermal pathway is formed from the component to the first subset of electrically conductive layers, to the plurality of electrically non-conductive layers, to the second subset of electrically conductive layers, and to the baseplate. In some embodiments, the integrated heat exchanger also includes a thermally conductive block embedded within the circuit board and coupled to the second subset of electrically conductive interconnects, wherein the thermally conductive block is exposed at the first surface of the circuit board. In some embodiments, the plurality of electrically non-conductive layers are thermally conductive, and a thermal pathway is formed from the electronic component to the first subset of electrically conductive layers, to the plurality of electrically non-conductive layers, to the second subset of electrically conductive layers, to the thermally conductive block, and to the baseplate. In some embodiments, the baseplate is further coupled to the thermally conductive block exposed at the first surface of the printed circuit board. In some embodiments, the circuit board further comprises a plated via electrically connected to the second subset of electrically conductive layers, further wherein the thermally conductive block is positioned within the plated via. In some embodiments, the plated via comprises a plated through hole via. In some embodiments, the thermally conductive block comprises a metal screw, and the baseplate comprises a hole for receiving the metal screw. In some embodiments, the metal screw includes a threaded first end and slotted head second end, and the hole in the baseplate is a threaded hole, further wherein the threaded first end extends from the first surface of the circuit board into the threaded hole in the baseplate. In some embodiments, a remaining portion of the metal screw between the threaded first end and the slotted head second end has a smooth surface in contact with a plated surface of the plated through hole via. In some embodiments, the circuit board further comprises a first plating layer on the interface conductive layer. In some embodiments, the baseplate is coupled to the first plating layer. In some embodiments, the circuit board further comprises a first surface electrically non-conductive layer coupled to the first surface of the circuit board and surrounding the first plating layer. In some embodiments, the circuit board further comprises a second plating layer positioned on a second surface of the circuit board opposite the first surface, the second plating layer coupled to the second subset of electrically conductive layers and the plated through hole via. In some embodiments, the slotted head second end of the metal screw is coupled to the second plating layer. In some embodiments, the first plating layer and the second plating layer each comprise gold. In some embodiments, the circuit board further comprises a second surface electrically non-conductive layer coupled to the second surface of the circuit board and surrounding the second plating layer. In some embodiments, the first surface electrically non-conductive layer and the second surface electrically non-conductive layer are each comprise soldermask. In some embodiments, the integrated heat exchanger also includes a thermally conductive and electrically non-conductive gap filler positioned between the electronic component and the baseplate.

In another aspect, another integrated heat exchanger is disclosed. The integrated heat exchanger includes a circuit board, an electronic component, a thermally conductive block, and a baseplate. The circuit board comprises a plurality of electrically non-conductive layers and a plurality of electrically conductive layers. The plurality of electrically conductive layers comprise a first subset of electrically conductive layers and a second subset of electrically conductive layers electrically isolated from the first subset of electrically conductive layers. The electronic component is coupled to a first surface of the circuit board and electrically connected to the first subset of electrically conductive layers. The thermally conductive block is embedded within the circuit board and thermally coupled to the second subset of electrically conductive interconnects, wherein the thermally conductive block is exposed at the first surface of the circuit board. The baseplate is thermally coupled to and electrically isolated from the electronic component, and thermally coupled to the thermally conductive block exposed at the first surface of the printed circuit board.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Figure 1:
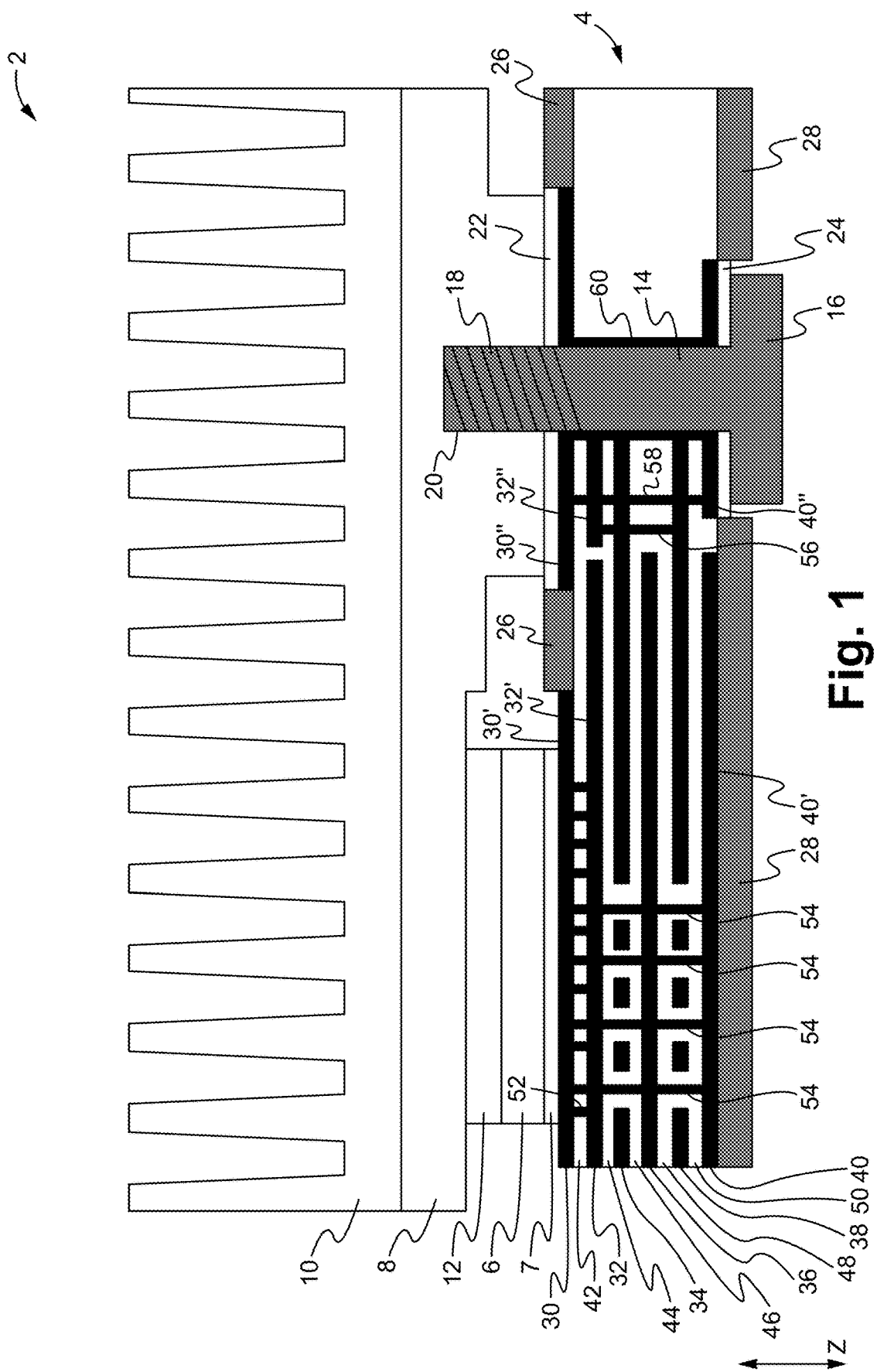
FIG. 1 illustrates a cut out side view of an integrated heat exchanger according to some embodiments.

Embodiments of the present application are directed to an integrated heat exchanger. Those of ordinary skill in the art will realize that the following detailed description of the integrated heat exchanger is illustrative only and is not intended to be in any way limiting. Other embodiments of the integrated heat exchanger will readily suggest themselves to such skilled persons having the benefit of this disclosure.

Reference will now be made in detail to implementations of the integrated heat exchanger as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers can be interconnected with plated or filled vias.

A printed circuit board includes a plurality of stacked layers, the layers made of alternating non-conductive layers and conductive layers. The non-conductive layers can be made of prepreg, such as FR-4, or base material that is part of a core structure, or simply core. Prepreg is a fibrous reinforcement material impregnated or coated with a thermosetting resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A via is then formed by drilling a hole through the laminated stack and plating the wall of the hole with electrically conductive material, such as copper. The resulting plating interconnects the conductive layers. Multiple such lamination steps can be performed to form the PCB. In some applications, a plated through hole (PTH) via can be formed that extends through the entire thickness of the PCB, and one or more conductive layers are connected to the plating.

The integrated heat exchanger includes a heat exchanger within a circuit board. In some embodiments, the circuit board is a PCB having one or more electronic components coupled to its top-side surface. In an exemplary application, the PCB and one or more electronic components are a SMPS. The conductive layers of the PCB are configured such that a first sub-set of conductive layers are electrically connected to each other and to the one or more electronic components. A second sub-set of conductive layers are electrically isolated from the first sub-set of conductive layers by intervening non-conductive layers such as prepreg. The second sub-set of conductive layers include a dedicated top-side conductive layer. In this manner, the heat exchanger is electrically isolated from the one or more electronic components. Including the heat exchanger within the PCB maximizes the heat transfer from the one or more electronic components to the electrically isolated heat exchanger in an efficient manner since the prepreg within the PCB has a minimized thickness. The heat transferred to the heat exchanger can be safely transferred to the top-side to the PCB where the heat exchanger is coupled to a baseplate. The dedicated top-side conductive layer on the top-side surface effectively distributes heat from the heat exchanger and provides an effective thermal interface with the baseplate. In some embodiments, the dedicated top-side conductive layer is gold plated, for example electroless nickel immersion gold (ENIG). The dedicated gold plated conductive layer is formed in a soldermask opening on the top-side surface of the PCB. In some embodiments, a highly efficient thermal grease, which can be electrically conductive or electrically non-conductive is used between the gold plated conductive layer and the baseplate increase the heat transfer, since neither the gold plated conductive layer nor the baseplate are perfectly flat surfaces. In some embodiments, the heat exchanger includes a metal screw having a threaded first end configured to screw into a threaded hole within the baseplate. The metal screw is fitted into a plated through hole that is connected to the second sub-set of conductive layers. The metal screw is also electrically isolated from the first sub-set of conductive layers. Since the metal screw is in contact with the plated through hole, either directly or through a thermal interface material, the metal screw also contributes to the heat transfer from the PCB to the base plate. The metal screw is used to mechanically increase pressure between the PCB and the baseplate.

FIG. 1 illustrates a cut out side view of an integrated heat exchanger according to some embodiments. The integrated heat exchanger 2 includes a circuit board 4 having an electronic component 6, a baseplate 8 coupled to electronic component 6 via a gap filler 12, and a heat sink 10 coupled to the baseplate 8. The circuit board 4 includes a stack of electrically conductive layers and intervening electrically non-conductive layers, and one or more electronic components attached to a surface of the circuit board. In the exemplary configuration shown in FIG. 1, the circuit board 4 includes electrically conductive layers 30, 32, 34, 36, 38, and 40, and electrically non-conductive layers 42, 44, 46, 48, and 50. It is understood that the circuit board can include more, or less, than the number of electrically conductive and electrically non-conductive layers shown in FIG. 1. Also in the exemplary configuration shown in FIG. 1, a single electronic component 6 is attached to a surface of the circuit board 4. It is understood that more than one electronic component can be attached to the circuit board. The electronic components can be attached to the circuit board using any conventional techniques including, but not limited to, SMT (surface mount technology) or THT (through hole technology). In the exemplary configuration shown in FIG. 1, the electronic component 6 is attached to the circuit board 4 using SMT.

The electrically conductive layers in the circuit board are selectively patterned to form at least two separate, electrically isolated sub-sets of electrically conductive interconnects. A first sub-set of electrically conductive interconnects is electrically connected to the electronic component 6. A second sub-set of electrically conductive interconnects is electrically connected to the baseplate 8. Each electrically conductive layer can be selectively patterned to be wholly part of the first-subset or wholly part of the second sub-set, or the electrically conductive layer can be selectively patterned such that a first portion is part of the first sub-set and a second portion is part of the second sub-set. As applied to FIG. 1, the entirety of electrically conductive layer 36 is part of the first sub-set of electrically conductive interconnects. The entirety of electrically conductive layers 34 and 38 are part of the second sub-set of electrically conductive interconnects. The electrically conductive layers 30, 32, and 40 each have a first portion, such as first portions 30', 32', 40', that is part of the first sub-set of electrically conductive interconnects and a second portion, such as second portions 30", 32", 40", that is part of the second sub-set of electrically conductive interconnects. Different layers of the electrically conductive interconnects that are part of the first sub-set of electrically conductive interconnects are interconnected by vias, such as vias 54, or microvias, such as microvias 52, also known as blind-vias. Heat transfer between connected electrically conductive layers is enhanced by the plated through hole vias, thereby providing a thermal distribution through the circuit board. In some embodiments, the electrically conductive interconnects in the first sub-set that correspond to the two electrically conductive layers closest to the electronic component, such as electrically conductive interconnects 30' and 32', are interconnected by microvias, which provides improved current transportation as well as improved heat transfer to the inner electrically conductive layers as compared to regular sized vias. Plated through hole vias can also be formed with corresponding electronic component pads for mounting the electronic component 6 to the circuit board 4. In some embodiments, such plated through holes are filled with resin and over-plated to form electronic component pads. Forming plated through hole vias as electronic component pads further increases current transportation and thermal transfer. The second sub-set of electrically conductive interconnects 30", 32", 34, 38, 40" can be interconnected by any number of vias, such as plated through hole via 58 and buried via 56.

In some embodiments, some or all of the first sub-set of electrically conductive interconnects 30', 32', 36, 40' and the second sub-set of electrically conductive interconnects 30", 32", 34, 38, 40" are formed as planes. Stacking interleaved planar portions of the first sub-set with the second sub-set results in large heat transferring areas. Additionally, the intervening electrically non-conductive layers are formed with minimum thickness to minimize thermal resistance between adjacently stacked planar surfaces of the first and second sub-sets of electrically conductive interconnects.

In some embodiments, the outer layer electrically conductive interconnects 30" and 40', the via plating, and the electronic component pads are formed of copper. To avoid oxidation, the portions of such electrically conductive layers exposed at the circuit board surface are gold plated, such as gold plating 7, 22, and 24. Gold plating of the electronic component pads also serves to improve the soldering process.

In some embodiments, the second sub-set of electrically conductive interconnects includes a plated through hole via 60 formed through the circuit board 4. The second sub-set of electrically conductive interconnects 30", 32", 34, 38, 40" are connected to the plated through hole via 60. A screw 14 is inserted in the plated through hole via 60. The screw 14 is made of a highly thermally conductive material, such as metal. The plated through hole via 60 and the screw 14 are sized so that the outer surface of the screw 14 firmly contacts the surface of the plated through hole 60. In some embodiments, a thermal interface material is placed between the screw 14 and the plated through hole via 60. In some embodiments, the screw 14 includes a head 16 that rests against gold plating 24, and a threaded end 18 that screws into a threaded hole 20 in the baseplate 8. It is understood that alternative fastening means can be used. For example, the screw can be replaced by a pin having an end that extends into a non-threaded hole in the baseplate. The pin can be secured in the hole using a thermally conductive adhesive.

Soldermask 26 and 28, or other insulating material, can be applied to the top and bottom surfaces of the circuit board 4, respectively, leaving select portions exposed, such as portions of the electrically conductive layers 30 and 40 corresponding to mounting of the electronic component 6, baseplate 8, and screw head 16.

Figure 2:
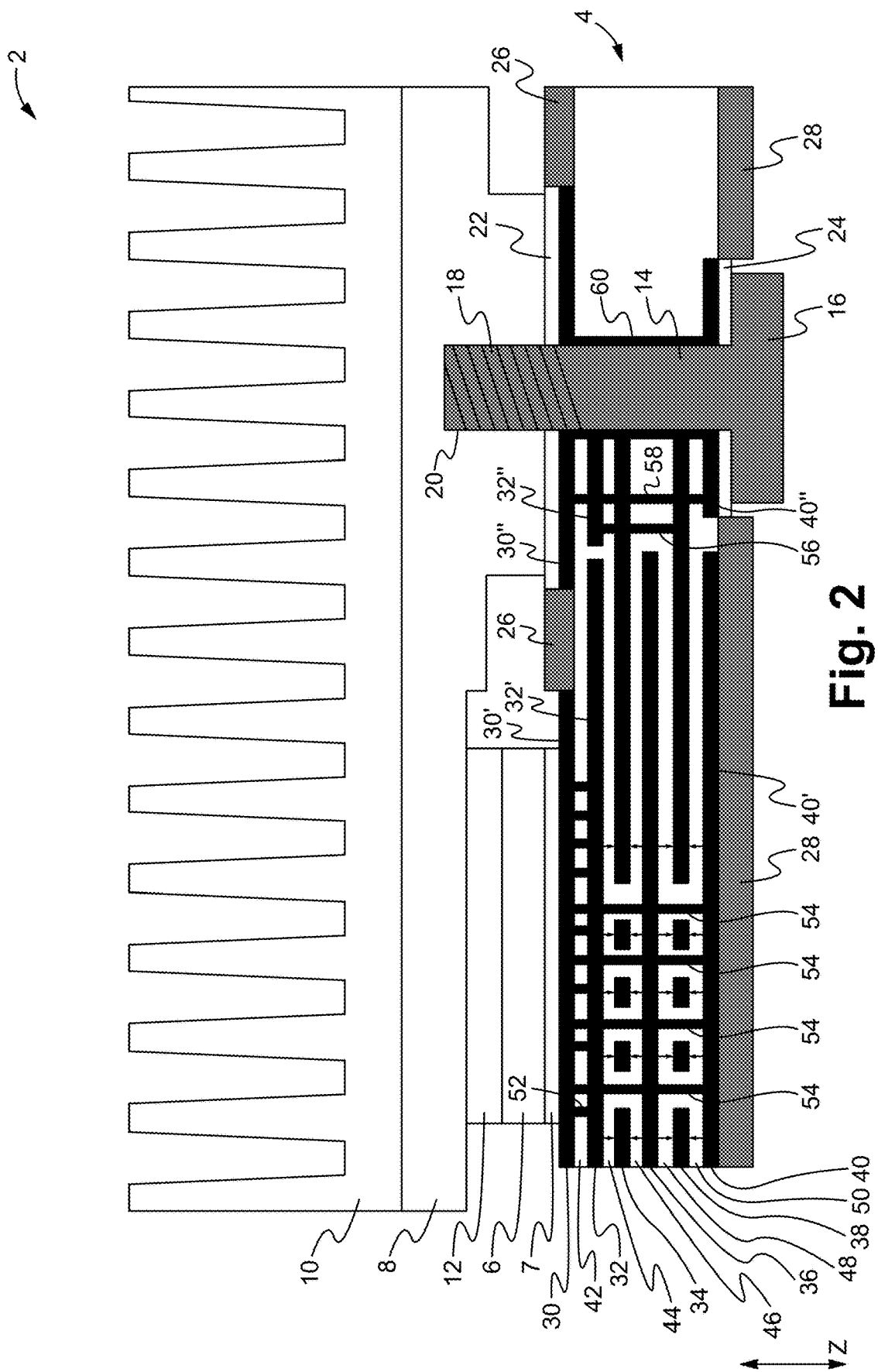
FIG. 2 illustrates the heat transfer between the first sub-set of electrically conductive interconnects and the second sub-set of electrically conductive interconnects of the integrated heat exchanger of FIG. 1.

In operation, heat generated by the electronic component 6 is transferred to the first sub-set of electrically conductive interconnects such as electrically conductive interconnects 30', 32', 36, and 40'. Heat is transferred from the first sub-set of electrically conductive interconnects to the second sub-set of electrically conductive interconnect via the intervening electrically non-conductive layers 42, 44, 46, 48, 50, as indicated by the arrows in FIG. 2. Heat is transferred from the second sub-set of electrically conductive interconnects, such as electrically conductive interconnects 30", 32", 34, 38, and 40", to the screw 14. Heat is transferred from the screw 14, as well as from the electrically conductive interconnect 30"/plating 22, to the baseplate 8. Heat generated from the electronic component 6 is also transferred to the baseplate 8 via the gap filler 12. Heat is transferred from the baseplate 8 to the heat sink 10. Heat is transferred from the heat sink 10 by convection. In some embodiments, the heat sink 10 can be coupled to a liquid based cooling system.

In some embodiments, the baseplate and the heat sink are discrete components coupled together. An intervening thermal interface material can be placed between the heat sink and the baseplate. In other embodiments, the baseplate and heat sink are formed as a single integrated component, which eliminates one thermal interface, thereby reducing the overall thermal resistance of the integrated heat exchanger.

The following shows exemplary heat transfer values as related to common materials used in the electronics industry and application to the integrated heat exchanger. It is understood that the following are exemplary values applied to exemplary applications.

Table 1 shows a short list of common materials used in the electronics industry and their corresponding thermal conductivities.

TABLE 1

| Material | Thermal Conductivity [W/mK], k |
| --- | --- |
| Air | 0.0275 |
| FR4 | 0.3 |
| Gap filler | 1.7 (effective value) |
| Soldermask | 0.21 |
| SAC305 (lead free solder compose) | 58 |
| Copper | 355 |

Air is a poor thermal conductor and thus can be neglected in the calculations below. The solder paste and copper can be treated as perfect thermal conductors. Thermal resistance is calculated as: $\theta = d/kA$, where, d is the thickness of the material, A is the heat transferring area, and k is the thermal conductivity. In a typical PCB stack-up, the FR4 thickness is 0.12 mm, the Gap filler thickness required for 750V isolation is 0.6 mm, and a typical solder mask layer thickness is 50 μm. These values yield the thermal resistance times the area values shown in Table 2:

TABLE 2

| Material | Thermal resistance × area [K/Wm] |
| --- | --- |
| FR4 | $0.4 \times 10^{-3}$ |
| Gap Filler | $0.35 \times 10^{-3}$ |
| Soldermask | $0.24 \times 10^{-3}$ |

In a conventional cooling, such as with a baseplate attached to an electronic component on a PCB via a gap filler, heat is transferred from the electronic component through the gap filler to the baseplate and also from the electronic component to the PCB. Heat within the PCB is dissipated through a soldermask applied to the outer surface. In this conventional case, for example heat transfer through the soldermask and gap filler, the total thermal resistance times area for the gap filler plus soldermask becomes $0.35+0.24=0.59 \times 10^{-3}$ K/Wm, with an 750V isolation. Using the integrated heat exchanger, the thermal transfer through the FR4 yields only a thermal resistance per unit area of $0.4 \times 10^{-3}$ K/Wm which is lower than the conventional case, and at the same time allowing for increased isolation to 2250 V.

In the conventional approach that uses an aluminum baseplate connected to an SMPS (electronic component) via a gap filler, the heat exchanging area for heat transportation is restricted to an interface area between the SMPS and the baseplate. In contrast, the heat exchanging area for the integrated heat exchanger is a matter of how much copper (electrically conductive interconnects) can be dispensed within the PCB for the heat exchanger. A standard eight brick SMPS measures 58.4×22.9 mm, having equivalent surface area of $1.337 \times 10^{-3}$ m². In an exemplary integrated heat exchanger design using an eight brick SMPS with 12-layer PCB stack-up, the effective area of the heat exchanger is $1.95 \times 10^{-3}$ m². The total thermal resistance in both cases is shown in Table 3:

TABLE 3

| Type | Area [m²] | Thermal resistance [K/W] |
| --- | --- | --- |
| Gap filler-soldermask | $1.337 \times 10^{-3}$ | 0.44 |
| Heat exchanger | $1.95 \times 10^{-3}$ | 0.205 |

As shown in Table 3, the integrated heat exchanger significantly reduces the thermal resistance compared to a conventional gap filler and soldermask design.

The present application has been described in terms of specific embodiments incorporating details to facilitate the understanding of the principles of construction and operation of the integrated heat exchanger. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An integrated heat exchanger comprising:
   a. a circuit board comprising a plurality of electrically non-conductive layers and a plurality of electrically conductive layers, wherein the plurality of electrically conductive layers comprise a first subset of electrically conductive layers and a second subset of electrically conductive layers electrically isolated from the first subset of electrically conductive layers by intervening the plurality of electrically non-conductive layers, wherein the second subset of electrically conductive layers includes an interface conductive layer on a first surface of the circuit board;
   b. an electronic component coupled to the first surface of the circuit board and electrically connected to the first subset of electrically conductive layers;
   c. a baseplate mounted to the electronic component and to the interface conductive layer on the first surface of the circuit board, wherein the baseplate is thermally coupled to and electrically isolated from the electronic component, and thermally and electrically coupled to the interface conductive layer;
   wherein the plurality of electrically non-conductive layers are thermally conductive, and a thermal pathway is formed from the component to the first subset of electrically conductive layers, to the plurality of electrically non-conductive layers, to the second subset of electrically conductive layers, and to the baseplate.

2. The integrated heat exchanger of claim 1 further comprising a heat sink coupled to the baseplate.

3. The integrated heat exchanger of claim 1 further comprising a thermally conductive block embedded within the circuit board and coupled to the second subset of electrically conductive layers, wherein the thermally conductive block is exposed at the first surface of the circuit board.

4. The integrated heat exchanger of claim 3 wherein the plurality of electrically non-conductive layers are thermally conductive, and the thermal pathway is formed from the electronic component to the first subset of electrically conductive layers, to the plurality of electrically non-conductive layers, to the second subset of electrically conductive layers, to the thermally conductive block, and to the baseplate.

5. The integrated heat exchanger of claim 3 wherein the baseplate is further coupled to the thermally conductive block exposed at the first surface of the circuit board.

6. The integrated heat exchanger of claim 3 wherein the circuit board further comprises a plated via electrically connected to the second subset of electrically conductive layers, further wherein the thermally conductive block is positioned within the plated via.

7. The integrated heat exchanger of claim 6 wherein the plated via comprises a plated through hole via.

8. The integrated heat exchanger of claim 7 wherein the thermally conductive block comprises a metal screw, and the baseplate comprises a hole for receiving the metal screw.

9. The integrated heat exchanger of claim 8 wherein the metal screw includes a threaded first end and slotted head second end, and the hole in the baseplate is a threaded hole, further wherein the threaded first end extends from the first surface of the circuit board into the threaded hole in the baseplate.

10. The integrated heat exchanger of claim 9 wherein a remaining portion of the metal screw between the threaded first end and the slotted head second end has a smooth surface in contact with a plated surface of the plated through hole via.

11. The integrated heat exchanger of claim 9 wherein the circuit board further comprises a first plating layer on the interface conductive layer.

12. The integrated heat exchanger of claim 11 wherein the baseplate is coupled to the first plating layer.

13. The integrated heat exchanger of claim 11 wherein the circuit board further comprises a first surface electrically non-conductive layer coupled to the first surface of the circuit board and surrounding the first plating layer.

14. The integrated heat exchanger of claim 13 wherein the circuit board further comprises a second plating layer positioned on a second surface of the circuit board opposite the first surface, the second plating layer coupled to the second subset of electrically conductive layers and the plated through hole via.

15. The integrated heat exchanger of claim 14 wherein the slotted head second end of the metal screw is coupled to the second plating layer.

16. The integrated heat exchanger of claim 14 wherein the first plating layer and the second plating layer each comprise gold.

17. The integrated heat exchanger of claim 14 wherein the circuit board further comprises a second surface electrically non-conductive layer coupled to the second surface of the circuit board and surrounding the second plating layer.

18. The integrated heat exchanger of claim 17 wherein the first surface electrically non-conductive layer and the second surface electrically non-conductive layer are each comprise soldermask.

19. The integrated heat exchanger of claim 1 further comprising a thermally conductive and electrically non-conductive gap filler positioned between the electronic component and the baseplate.

20. An integrated heat exchanger comprising:
   a. a circuit board comprising a plurality of electrically non-conductive layers and a plurality of electrically conductive layers, wherein the plurality of electrically conductive layers comprise a first subset of electrically conductive layers and a second subset of electrically conductive layers electrically isolated from the first subset of electrically conductive layers;

b. an electronic component coupled to a first surface of the circuit board and electrically connected to the first subset of electrically conductive layers;

c. a thermally conductive block embedded within the circuit board and thermally coupled to the second subset of electrically conductive layers, wherein the thermally conductive block is exposed at the first surface of the circuit board;

d. a baseplate thermally coupled to and electrically isolated from the electronic component, and thermally coupled to the thermally conductive block exposed at the first surface of the circuit board, wherein the plurality of electrically non-conductive layers are thermally conductive, and a thermal pathway is formed from the component to the first subset of electrically conductive layers, to the plurality of electrically non-conductive layers, to the second subset of electrically conductive layers, and to the baseplate.

21. An integrated heat exchanger comprising:

a. a circuit board comprising a plurality of electrically non-conductive layers and a plurality of electrically conductive layers, wherein the plurality of electrically conductive layers comprise a first subset of electrically conductive layers and a second subset of electrically conductive layers electrically isolated from the first subset of electrically conductive layers by intervening the plurality of electrically non-conductive layers, wherein the second subset of electrically conductive layers includes an interface conductive layer on a first surface of the circuit board;

b. an electronic component coupled to the first surface of the circuit board and electrically connected to the first subset of electrically conductive layers;

c. a baseplate mounted to the electronic component and to the interface conductive layer on the first surface of the circuit board, wherein the baseplate is thermally coupled to and electrically isolated from the electronic component, and thermally and electrically coupled to the interface conductive layer; and d. a thermally conductive block embedded within the circuit board and coupled to the second subset of electrically conductive layers, wherein the thermally conductive block is exposed at the first surface of the circuit board, wherein the plurality of electrically non-conductive layers are thermally conductive, and a thermal pathway is formed from the electronic component to the first subset of electrically conductive layers, to the plurality of electrically non-conductive layers, to the second subset of electrically conductive layers, to the thermally conductive block, and to the baseplate.

* * * * *